(12) United States Patent
Perndl et al.

(10) Patent No.: US 9,239,344 B2
(45) Date of Patent: Jan. 19, 2016

(54) THERMALLY STABILIZED POWER SENSOR

(75) Inventors: Werner Perndl, Zorneding (DE); Toralf Bratfisch, Putzbrunn (DE); Michael Katzer, Munich (DE); Thomas Reichel, Lichtenau (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 339 days.

(21) Appl. No.: 13/885,666

(22) PCT Filed: Nov. 4, 2011

(86) PCT No.: PCT/EP2011/069460
§ 371 (c)(1),
(2), (4) Date: Jul. 18, 2013

(87) PCT Pub. No.: WO2012/065866
PCT Pub. Date: May 24, 2012

(65) Prior Publication Data
US 2013/0285642 A1    Oct. 31, 2013

(30) Foreign Application Priority Data

Nov. 15, 2010    (DE) .......................... 10 2010 051 432

(51) Int. Cl.
*G01R 1/44*        (2006.01)
*G01R 21/14*       (2006.01)
*G01R 21/10*       (2006.01)

(52) U.S. Cl.
CPC ................ *G01R 21/14* (2013.01); *G01R 21/10* (2013.01)

(58) Field of Classification Search
None
See application file for complete search history.

(56) References Cited

U.S. PATENT DOCUMENTS

| 3,355,666 A |   | 11/1967 | Vought et al. |
| 4,471,355 A | * | 9/1984 | Hardy .................... G01R 15/18 324/96 |
| 4,791,380 A |   | 12/1988 | Chiappetta |
| 4,932,075 A |   | 6/1990 | Dimitrijevic et al. |
| 5,936,537 A |   | 8/1999 | Burns et al. |
| 5,937,059 A |   | 8/1999 | Kim et al. |

FOREIGN PATENT DOCUMENTS

| DE | 195 27 226 A1 | 1/1997 |
| DE | 197 27 972 A1 | 1/1998 |
| DE | 100 39 665 A1 | 2/2002 |

(Continued)

OTHER PUBLICATIONS

International Search Report for International Application No. PCT/EP2011/069460 dated Jun. 2, 2012, pp. 1-3.

(Continued)

*Primary Examiner* — Paresh Patel
(74) *Attorney, Agent, or Firm* — Ditthavong & Steiner, P.C.

(57) ABSTRACT

A power-measurement device includes a power detector and a tempering device. The power detector is integrated on a monolithic chip as an integrated circuit. It converts a high-frequency test signal into a signal which displays the power of the high-frequency test signal. The power-measurement device further includes a signal input. In this context, the tempering device is arranged outside the monolithic chip on a side of the monolithic chip facing away from the integrated circuit. The signal input is connected to the power detector by a first line on a synthetic substrate. The signal input guides the high-frequency test signal to the power detector by the first line.

15 Claims, 4 Drawing Sheets

(56) References Cited

FOREIGN PATENT DOCUMENTS

| DE | 10 2008 057 607 A1 | 5/2010 |
|----|---------------------|--------|
| EP | 0 852 434 A2 | 7/1998 |
| EP | 1 026 822 A2 | 8/2000 |
| GB | 1014728 | 12/1965 |
| JP | 10-267970 A | 10/1998 |
| WO | 02/10776 A1 | 2/2002 |

OTHER PUBLICATIONS

R. Pratt, "Very-Low-Level Microwave Power Measurements," Hewlett-Packard Journal, vol. 27, No. 2, Oct. 1, 1975, pp. 8-10.

* cited by examiner

THERMALLY STABILIZED POWER SENSOR

BACKGROUND OF THE INVENTION

1. Field of the Invention

The invention relates to a power sensor, especially a diode detector.

2. Discussion of the Background

Conventional power sensors use discrete detector diodes arranged in a hermetically encapsulated housing on a substrate, whereas the substrate is disposed in close thermal contact with the housing. Because of its high mass of, for example, 50 g, such a metallic housing provides a high thermal capacity. This leads to a high time constant with regard to a reaction to changes in temperature, if the housing were to be heated. Beyond this, a considerable thermal power would be necessary in order to heat the large mass.

With diode sensors, such as those shown in DE 100 39 665 A1, temperature fluctuations lead to various negative effects on the measurement result. For example, on the one hand, the zero-point resistance of the diodes is temperature dependent. This leads to different terminating resistances and accordingly to different reflection coefficients. In the case of Schottky diodes, a resistance-dependence of −4%/K is provided, for example. That is to say, with a temperature change of 15 K, the zero-point resistance of the detector diode is halved. Furthermore, the noise behavior of the detector diodes is also temperature dependent.

To prevent a falsification of the measured values of the diode detector resulting from its temperature dependence, compensation circuits are used. For instance, EP 1 026 822 B1 discloses a diode detector with compensated temperature drift. The disadvantage here is that the compensation cannot, on the one hand, eliminate all residual errors, and, on the other hand, a noise behaviour and reflection behaviour of the detector influenced by temperature changes cannot be compensated by this compensation.

Furthermore, the Japanese patent JP 10 267 970 A shows a power detector embodied as an integrated circuit. A heating diode is integrated in the integrated circuit. In this context, the high-frequency signal is supplied through a hollow conductor. The integrated circuit is disposed in an interruption of the hollow conductor. Part of the power of the high-frequency signal is received and supplied to the power detector by means of antennas which are also a part of the integrated circuit. The disadvantage here is that this structure is only suitable for supplying the signal by means of a hollow conductor.

SUMMARY OF THE INVENTION

The invention advantageously provides a power-measurement device which allows very high measurement accuracy together with low energy consumption and low manufacturing costs.

The power-measurement device according to an embodiment of the invention provides a power detector and a tempering device. The power detector is integrated on a monolithic chip as an integrated circuit. It converts a high-frequency test signal into a signal which displays the power of the high-frequency test signal. The power-measurement device further comprises a signal input. The signal input is connected to the power detector in a thermally insulating manner by means of a first line on a synthetic-material substrate. The signal input guides the high-frequency-test signal to the power detector by means of the first line. Accordingly, a very precise measurement can be achieved with low manufacturing costs.

In this context, the tempering device is preferably arranged on a side of the monolithic chip facing away from the integrated circuit. By arranging the tempering device on the rear side, a very uniform tempering of the power detector is possible because this can take place over the full surface area.

The constant temperature is advantageously achieved through a low thermal coupling of the power detector to the remainder of the power-measurement device. Accordingly, only a low heating power is required. Furthermore, a low time constant is achieved in this manner. This avoids a heating of the entire power meter.

The low thermal capacity is advantageously achieved through a low mass and a low specific thermal capacity of the material of the power detector. An exemplary conventional power detector has a mass of 50 g, requires a heating power of 5 W and achieves a time constant of 1-2 min. A power detector according to the invention has a mass of only approximately 1.5 µg, a heating power of 100 mW and a time constant of less than one second.

The low thermal coupling is preferably achieved by insulating the power detector from the remainder of the power detector. The electrical connection by means of coplanar lines, striplines or slotlines is advantageously implemented on preferably flexible synthetic-material substrates. In particular, a thermal decoupling of the high-frequency input is achieved in this manner. Because the inner conductor is not coupled directly but only indirectly via the line on the synthetic-material substrate, the supply takes place via a coaxial line. Accordingly, the power detector is thermally decoupled from the inner conductor of the coaxial line in a particularly successful manner.

Moreover, output signals of the power detector are advantageously guided away via further lines on the synthetic-material substrate. This achieves a further simplification in manufacture.

The substrate is thin, with a preferred thickness of 1 µm-1 mm, by particular preference 10 µm-100 µm.

BRIEF DESCRIPTION OF THE DRAWINGS

The invention is described by way of example below with reference to the drawings which illustrate an advantageous exemplary embodiment of the invention. The drawings are as follows.

DETAILED DESCRIPTION OF EXEMPLARY EMBODIMENTS OF THE INVENTION

Figure 1:
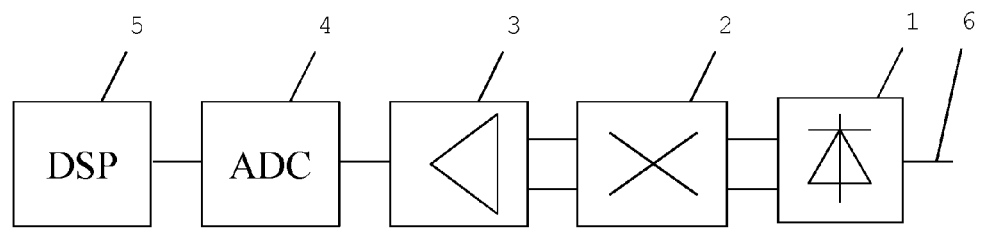
FIG. 1 an exemplary power-measurement device.

Initially, on the basis of FIG. 1, the general structure and method of functioning of an exemplary power-measurement device and the underlying problems are explained. Following this, the detailed structure and method of functioning of various forms of the power-measurement device according to the invention are explained in greater detail with reference to FIGS. 2-6. The presentation and description of identical elements in similar drawings has not been repeated in some cases.

With conventional detector diodes for power sensors, it is necessary to select the zero-point resistance of the diode in such a manner that it is sufficiently high by comparison with the terminating resistance of, for example, 50Ω over the entire temperature range of the power sensor. At the same time, it is desirable to achieve the lowest possible zero-point resistance in order to reduce the noise signal. For example, if a zero-point resistance of $R_0=5$ kΩ at 25° C. is selected, a resistance of $R_0=15.8$ kΩ is obtained, for example, with an exemplary lower temperature limit of 0° C., while, with an exemplary upper limit value of the operating temperature of 50° C., for example, a zero-point resistance of $R_0=1.58$ kΩ is obtained. Both values are still disposed significantly above the terminating resistance of 50Ω. However, if the power sensor is to be used at significantly higher temperatures, the zero-point resistance $R_0$ reaches a similar order of magnitude to that of the terminating resistance and therefore has a problematic effect. At substantially lower temperatures, the resistance is so high that it has a negative influence on the noise behaviour.

The temperature dependence of the zero-point resistance $R_0$ can be compensated by means of circuit-technology or by follow-on processing of the test results. However, the temperature dependence of the noise behaviour of the diode sensors cannot be compensated. In particular, since conventional diode sensors provide a significant mass and therefore a significant thermal capacity, it has so far not been possible to stabilize the latter in their temperature without significant energy consumption and, at the same time, without triggering undesirable thermal effects.

FIG. 1 shows an exemplary power-measurement device. A power detector 1 is connected to a signal input 6. Furthermore, the power detector 1 is connected to a chopper 2. The power detector is a high-frequency detector. The chopper 2, in turn, is connected to an amplifier 3. The amplifier 3 is further connected to an analog-digital converter 4, which is further connected to a digital-signal processor 5.

A high-frequency signal to be measured is supplied to the power detector 1 by means of the signal input 6. The power detector 1 converts the high-frequency signal into a signal which displays the power of the high-frequency signal. For this purpose, the power detector 1 squares the high-frequency signal. In this context, the power detector 1 preferably contains at least one detector diode, of which the exponential characteristic is used for squaring the high-frequency signal.

The output signal of the power detector 1 is supplied to the chopper 2. The latter multiplies the signal alternately with +1 and −1 and therefore compensates offsets of the downstream amplifier 3. The resulting signal of the chopper 2 is supplied to the amplifier 3, which amplifies it and supplies it to the analog-digital converter 4. The analog-digital converter 4 digitises the signal and supplies the resulting digital signal to the digital-signal processor 5. The digital-signal processor 5 implements a follow-on processing with synchronous demodulation of the signal. For example, in the case of a conventional power-measurement device, the digital-signal processor 5 implements the temperature compensation.

Now, in the case of a power-measurement device according to the invention, the temperature of the power detector 1 is held constant by means not illustrated in this drawing. That is to say, no temperature drift of the output voltage occurs. The noise behaviour is also constant. Similarly, the zero-point resistance $R_0$ of the detector diodes is constant within the power detector 1. Accordingly, a significantly more accurate test result is obtained than with a conventional power-measurement device.

In view of the constant temperature of the power detector and therefore of the detector diodes, a zero-point resistance $R_0$ can thus be selected, which is dependent only upon the terminating resistance of the remainder of the circuit, that is to say, the zero-point resistance $R_0$ can be selected to be very much lower than in the case of conventional detector diodes, of which the temperature is not held constant. With a terminating resistance of 50Ω, it is possible to select, for example, an $R_0$ of 500Ω. This achieves a minimal noise. Especially in the case of broadband diode sensors, the advantage is achieved that, with a constant temperature of the detector diodes, a characterization over different temperature ranges is not required. The downstream compensation can also be dispensed with.

In the following FIGS. 2-6, exemplary embodiments of the power-measurement device according to the invention are shown. In this case, only the power detectors contained are illustrated. The remainder of the structure corresponds to the structure of the exemplary power—the measurement device from FIG. 1.

Figure 2:
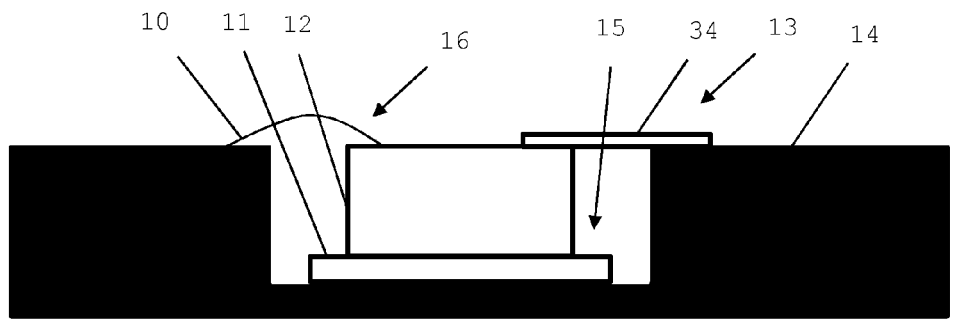
FIG. 2 a first exemplary embodiment of the power-measurement device according to the invention.

FIG. 2 shows a first exemplary embodiment of the power-measurement device according to the invention. A metallic housing 14 provides a recess 16. This recess 16 is dimensioned in such a manner that the complete power detector 12 can be received by the recess 16. The power detector 12 illustrated here is an integrated circuit on a monolithic microchip.

Previous power detectors have been mounted on printed circuit boards or on a ceramic substrate. Especially such ceramic substrates provide a significant thermal conductivity because of their thickness. Gluing or clamping into a housing leads to an intensive thermal coupling.

A Peltier element 11 is arranged in the recess 16 connected to the metallic housing 14. It is in good thermal contact with the housing 14. Only the first side of the Peltier element 11 is connected to the housing 14. The power detector 12 is arranged on the second side of the Peltier element 11. The latter is also disposed in good thermal contact with the Peltier element 11. The Peltier element is a tempering device 15. The term tempering device in this context refers merely to a heat/cold source. An air-filled cavity which ensures a poor thermal coupling of the power detector 12 and the housing 14 is disposed laterally between the power detector 12 and the metallic housing 14.

The power detector 12 according to the invention is completely integrated on a monolithic microchip. This microchip provides a very small size of, for example, 1 mm×1 mm×approximately 100 μm. A very low thermal capacity is achieved because of the very low mass.

The high-frequency signal to be measured is supplied to the power detector 12 by means of a line 13 on a preferably flexible synthetic-material substrate 34. The coplanar line 13 accordingly connects conductive surfaces applied to the surface of the power detector 12, which are not illustrated here, to further circuit elements, mounted, for example, in an electrically insulated manner on the upper side of the metallic housing 14. In this context, the line 13 is attached to the underside of the substrate 34. That is, the line 13 is attached to the side of the substrate 34 facing away from the power detector. The line 13 is insulated from the metallic housing 14. The conductive surfaces on the upper side of the power detector 12 and also the further circuit elements on the upper side of the metallic housing 14 are not illustrated here.

The power detector 12 is further connected via bonding wires 10 to further circuit elements arranged in an insulated manner, for example, on the upper side of the housing 14, which are not illustrated here. The output signal of the power detector 12 is advantageously transmitted via the bonding wires 10.

The power detector 12 provides only a low mass and therefore a low thermal capacity. The cavity between the recess 16 and the power detector 12 ensures a poor thermal coupling between the power detector 12 and the metallic housing 14. In this context, the line 13 is preferably a coplanar line. As an alternative, however, it can be a stripline (micro-stripline) or a slotline or a finline. The substrate 34 is preferably flexible. As an alternative, however, it can also be rigid. The substrate provides a very small cross-section and a low thermal conductivity. As a result, a low thermal coupling between the power detector 12 and the metallic housing 14 is provided by the line 13 and the substrate 34. The bonding wires 10 also provide a very small diameter. These therefore also contribute only very little to a thermal conductivity between the power detector 12 and the housing 14.

The Peltier element 11 can be made to provide a cold side and a warm side by applying a direct voltage. That is to say, by applying a controlled operating voltage to the Peltier element 11, the temperature of the power detector 12 relative to the metallic housing 14 can be varied. Since the thermal capacity of the metallic housing is considerably greater than the thermal capacity of the power detector 12, the thermal capacity of the metallic housing 14 plays no role in the functioning of the Peltier element 11.

Alongside the at least one detector diode, the power detector 12 additionally advantageously contains a temperature-measurement circuit and a control circuit for the tempering device 15. That is, the temperature-measurement circuit of the power detector 12 measures the temperature of the power detector 12, for example, by means of an integrated temperature-dependent resistance. As an alternative, the control circuit can also be mounted outside. Starting from the measured temperature of the power detector 12, the control circuit for the tempering device 15 controls the tempering device in such a manner that the temperature of the power detector 12 adopts a constant value.

The power detector is advantageously held at a temperature above the permitted maximum ambient temperature of the power-measurement device. Accordingly, it is only necessary to heat the power detector 12 independently from the actual ambient temperature. A cooling of the power detector 12 is not necessary in this case. This is advantageous, because Peltier elements provide a very high efficiency if they are used for heating. At the same time, they provide a relatively poorer efficiency if they are used for cooling.

The power detector 12 can contain first amplifier circuits and further processing circuits, already additionally integrated on the microchip.

Figure 3:
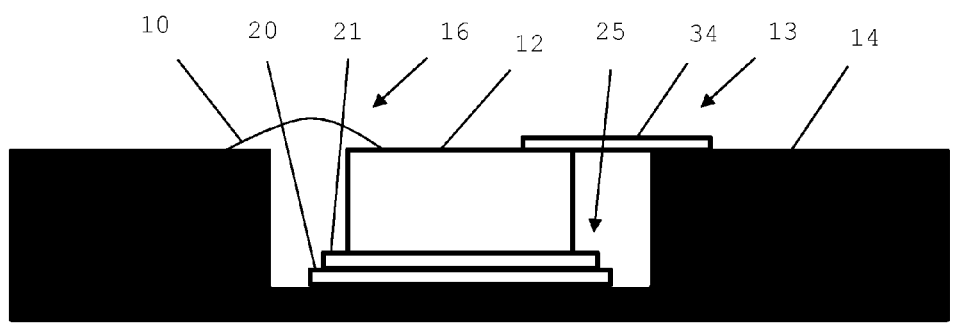
FIG. 3 a second exemplary embodiment of the power-measurement device according to the invention.

FIG. 3 shows a second exemplary embodiment of the power-measurement device according to the invention. Here also, only the power detector 12 is illustrated in its installed condition. The exemplary embodiment illustrated here corresponds largely to the exemplary embodiment shown in FIG. 2. The tempering device 25 here corresponds to the tempering device 15 from FIG. 2. However, the tempering device 25 provides an insulation element 20 and a heating element 21 instead of the Peltier element 11 from FIG. 2. The insulation element 20 is arranged between the metallic housing 14 and the heating element 21. It insulates the heating element 21 thermally from the metallic housing 14. The power detector 12 is disposed in good thermal contact with the heating element 21. Because of the insulation element 20, the power detector 12 is disposed in poor thermal contact with the metallic housing 14. Otherwise, the function corresponds to the function illustrated with reference to FIG. 2. The control circuit, which is not illustrated here, controls the heating element 21 instead of the Peltier element.

Figure 4:
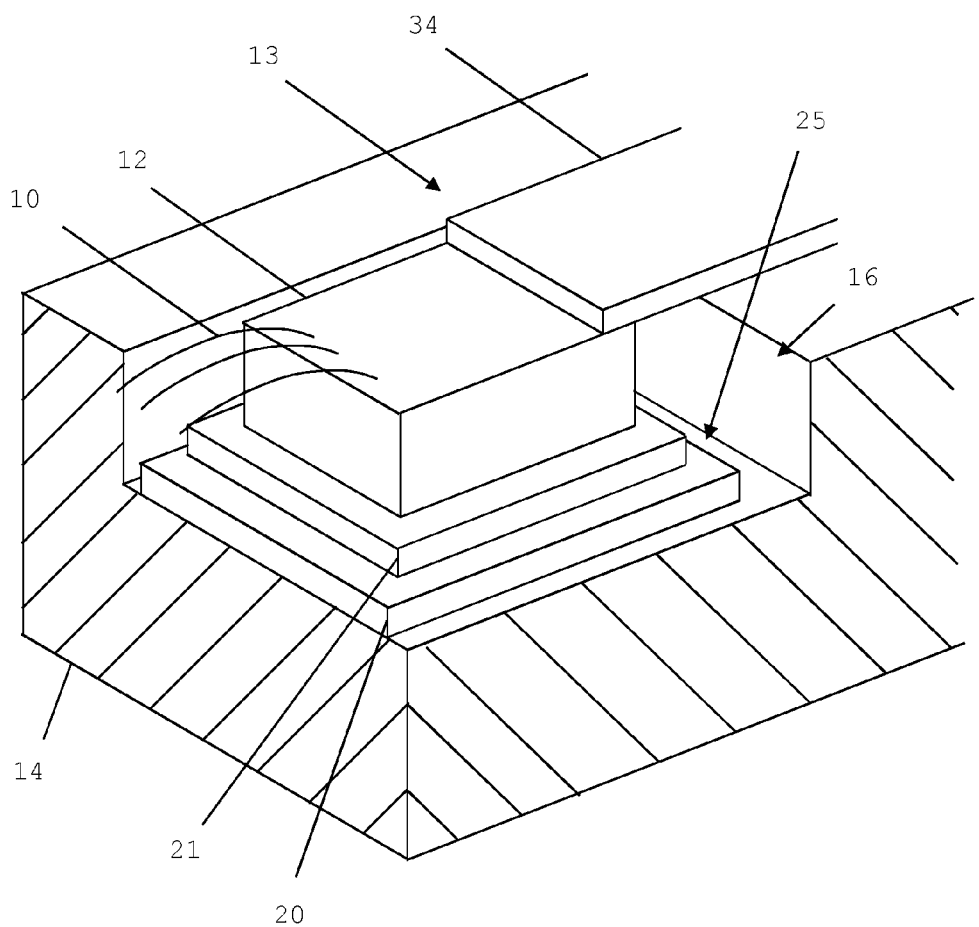
FIG. 4 the second exemplary embodiment of the power-measurement device according to the invention in an alternative view.

FIG. 4 shows an alternative view of the second exemplary embodiment of the power-measurement device according to the invention illustrated in FIG. 3. The hatched areas in this context correspond to the sectional planes. That is, the recess 16 surrounds the power detector 12 on five of six sides.

Instead of a Peltier element 11 or a heating element 21, a temperature-dependent resistor or a thermistor can also be used. In this case, a temperature-measurement circuit 12 is not necessary. These components require only a constant voltage supply, in order to adjust a constant temperature. The structure then corresponds to the structure from FIG. 3, whereas the heating element 21 is replaced by the temperature-dependent resistor or the thermistor.

Figure 5:
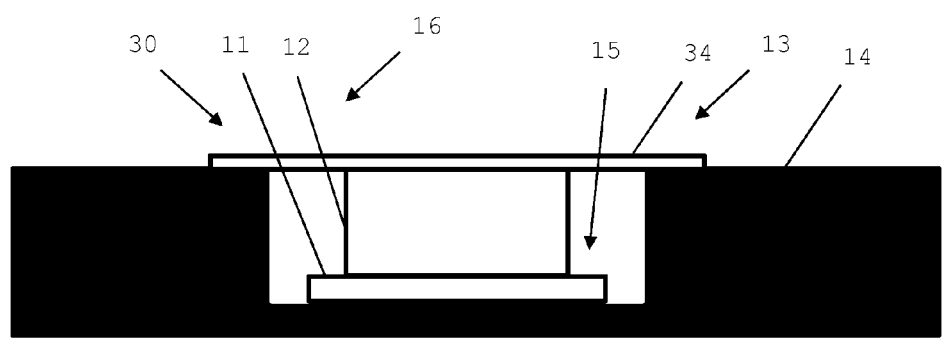
FIG. 5 a third exemplary embodiment of the power-measurement device according to the invention.

FIG. 5 shows a third exemplary embodiment of the power-measurement device according to the invention. Here, the synthetic-material substrate 30 covers the entire recess 16. That is, between the edge of the power detector 12 and the edge of the metallic housing 14, a gap remains, which is covered on all four sides by the substrate 30. This ensures a relatively higher mechanical stability of the synthetic-material substrate 30 and also a more uniform temperature distribution to the power detector 12.

Alongside the first line 13, the synthetic-material substrate 34 advantageously contains a second line 30, which supplies the high-frequency signal to the power detector 12. The second line 30 transmits the output signal of the power detector 12 to further switching elements arranged outside the power detector 12. A reduction in manufacturing costs is achieved by the embodiment of the first line 13 and the second line 30 on the common synthetic-material substrate 34, because the additional processing of bonding wires 10 is no longer required. However, it is also possible to provide two separate substrates for the two lines.

Figure 6:
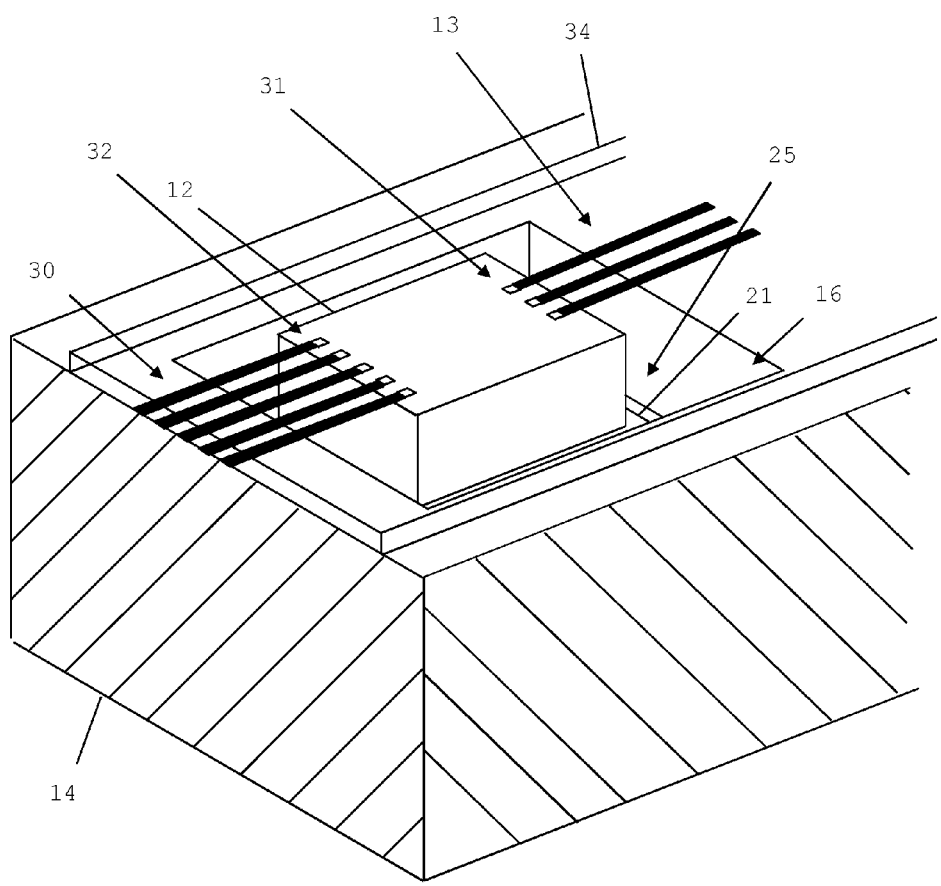
FIG. 6 the third exemplary embodiment of the power-measurement device according to the invention in an alternative view.

FIG. 6 shows the third exemplary embodiment in an alternative view. For improved visibility, the synthetic-material substrate 34 has been shown as transparent here. The sectional planes of the metallic housing 14 are disposed further out than in the case of FIG. 4. That is, all four limits of the recess 16 in the metallic housing 14 are visible. It is clearly evident here that the synthetic-material substrate 34 completely covers the recess 16 in the metallic housing 14. The first line 13 and the second line 30 are attached to the underside of the synthetic-material substrate 34, that is, on the side of the synthetic-material substrate 34 facing towards the power detector 12. In this context, the first line 13 contacts first connection points 31 on the side of the power detector 12 facing towards the synthetic-material substrate 34. The first line 13 is embodied here as a coplanar line, a stripline or a slotline. Dependent upon the type of line used, the line also extends on the upper side of the synthetic-material substrate 34.

The second line 30 is connected to connection points 32 on the upper side of the chip, that is, on the side of the power detector 12 facing towards the synthetic-material substrate 34. Dependent upon the type of line used, the second line 30 can also extend on the upper side of the synthetic-material substrate 34. It is also conceivable for the second line 30 to be embodied with several wires. That is, more than one signal can be removed via the second line 30. Alternatively, a supply of signals via the second line 30 is also possible. Accordingly, for example, the control voltage of the tempering device 25 can be transmitted via the second line 30.

In an alternative embodiment, the entire recess 16 of the metallic housing 14 is not covered by the synthetic-material substrate 34, but only the two sides which contain the first line 13 and the second line 30. That is, a gap remains on the other two sides between the synthetic-material substrate 34 and the recess 16.

In a further alternative embodiment, further lines can lead from the power detector 12. The latter are then also arranged on the synthetic-material substrate 34. Accordingly, lines could lead away from the power detector 12, for example, in all four directions.

The invention is not restricted to the exemplary embodiment illustrated. It is also conceivable for more than one detector diode to be accommodated on the power detector. Instead of a coplanar line, a different strip-conductor technology, for example a stripline technology or a tri-plate technology can also be used. All of the features described above or illustrated in the drawings can be advantageously combined with one another as required within the scope of the invention.

The invention claimed is:

1. A power-measurement device, comprising:
a power detector; and
a tempering device,
whereas the power detector is integrated on a monolithic chip as an integrated circuit and converts a high-frequency test signal into a signal which displays the power of the high-frequency test signal,
whereas the power-measurement device provides a signal input,
wherein the signal input is connected to the power detector by a first line on a synthetic-material substrate,
wherein the high-frequency test signal is guided from the signal input to the power detector by the first line, and
wherein the synthetic-material substrate is embodied with a thickness of 10 μm-100 μm.

2. The power-measurement device according to claim 1, wherein the tempering device is arranged outside the monolithic chip on a side of the monolithic chip facing away from the integrated circuit.

3. The power-measurement device according to claim 1, wherein the power detector provides a very low thermal capacity by comparison with the remainder of the power-measurement device.

4. The power-measurement device according to claim 1, wherein the integrated circuit contains at least one detector diode.

5. The power-measurement device according to claim 1, wherein the integrated circuit contains an amplifier circuit.

6. The power-measurement device according to claim 1, wherein the first line is a coplanar line or a slotline or a stripline or a finline.

7. The power-measurement device according to claim 1, wherein the tempering device is embodied in order to heat the power detector, and
wherein the tempering device contains an ohmic heating resistor or a thermistor.

8. The power-measurement device according to claim 1, wherein the tempering device is embodied in order to heat and to cool the power detector, and
wherein the tempering device contains a Peltier element.

9. The power-measurement device according to claim 1, wherein the power detector is largely thermally decoupled from the remainder of the power-measurement device.

10. The power-measurement device according to claim 1, wherein the power-measurement device further provides a metallic housing,
wherein the power detector is embedded in a recess of the metallic housing, and
wherein the power detector is thermally insulated from the metallic housing.

11. The power-measurement device according to claim 10, wherein the synthetic-material substrate of the first line covers the entire recess of the metallic housing.

12. The power-measurement device according to claim 1, wherein the first line is connected to connection points on the side of the monolithic chip facing towards the integrated circuit.

13. The power-measurement device according to claim 1, wherein the synthetic-material substrate or a further synthetic-material substrate bears a second line, and
wherein the second line is embodied in order to transmit an output signal of the power detector (12).

14. The power-measurement device according to claim 13, wherein the second line is connected to second connection points on the side of the monolithic chip facing towards the integrated circuit.

15. The power-measurement device according to claim 1, wherein the synthetic-material substrate is a flexible synthetic-material substrate.

* * * * *